United States Patent [19]

Kunkler et al.

[11] Patent Number: 5,402,322

[45] Date of Patent: Mar. 28, 1995

[54] MODULAR WALL-MOUNTED EQUIPMENT ENCLOSURE

[75] Inventors: Jeffery S. Kunkler, Fond du Lac; Gene D. Goetz, Shorewood, both of Wis.;

[73] Assignee: Johnson Service Company, Milwaukee, Wis.

[21] Appl. No.: 154,807

[22] Filed: Nov. 19, 1993

[51] Int. Cl.⁶ .......................... H05K 7/18; H05K 5/00
[52] U.S. Cl. ................................. 361/809; 174/52.1; 220/4.02
[58] Field of Search ............... 361/679, 728, 729, 730, 361/731, 732, 747, 807, 809, 810, 774; 174/50, 50.54, 52.1, 54, 58, 61, 63; 220/4.02

[56] References Cited

U.S. PATENT DOCUMENTS

| | | | |
|---|---|---|---|
| 4,027,096 | 5/1977 | Waddington et al. | 174/52.1 |
| 4,260,850 | 4/1981 | Brown et al. | 174/52.1 |

*Primary Examiner*—Bot Ledynh
*Attorney, Agent, or Firm*—Joseph E. Root, III; Edward L. Levine

[57] ABSTRACT

A wall-mounted enclosure for mounting electrical and electronic equipment and the like, in modular form. The enclosure body takes the form of a mounting assembly, including mounting modules, with each module including a backbone element and a cover element. The backbone element has a horizontally extending backplane bordered by two upstanding side portions, with an interassembly connecting mechanism for joining one backbone element to an adjacent backbone element. The backplane includes a flat mounting surface, with a pattern of preformed pilot holes, and two recessed wiring channels. Interconnection is provided by interlocks and screw anchor points. The cover element includes a horizontally extending cover plate with coverwalls and a cover assembly connecting mechanism for joining one cover element to another cover element. Adjacent cover elements are joined by mutual engagement of a mating tab and slot, and by screw anchor points. The cover element is removably mounted on the backbone element to rotate between an open position and a closed position. Modules are assembled into the mounting assembly by coplanar abutment of modules with mutual engagement of the backbone assembly connecting mechanism and the cover assembly connecting mechanism. Two identical endcap elements are joined to the outermost modules of the mounting assembly to enclose an interior enclosure space.

5 Claims, 4 Drawing Sheets

MODULAR WALL-MOUNTED EQUIPMENT ENCLOSURE

BACKGROUND OF THE INVENTION

The present invention relates generally to the field of devices for protectively mounting equipment, and more particularly to the field of devices mounted on a wall for enclosing equipment and instruments.

The wall-mounted enclosure for electrical and electronic equipment is a familiar fixture, yet the art has yet to deal with the problem posed by a system that has varying equipment requirements, so that a single size enclosure will not suffice. More important, the art has yet to deal with the problem of upgrading existing systems to accommodate additional equipment within an enclosure. At present, the art demands that a new enclosure be installed, after dismantling existing installations. That situation, of course, leads to excessive system downtime and upgrade cost. The present invention addresses that problem and offers a cost-effective solution.

SUMMARY OF THE INVENTION

The broad object of the present invention is to provide a modular enclosure for housing electronic, electrical and other equipment.

This object is achieved in the present invention of a wall-mounted enclosure for mounting electrical and electronic equipment and the like. The enclosure body takes the form of a mounting assembly, including mounting modules, with each module including a backbone element and a cover element. The backbone element has a horizontally extending backplane bordered by two upstanding side portions and two abutment edges, with interassembly connecting means for joining one backbone element to an adjacent backbone element. Looking at the backbone element, the side pieces include hinge accepting means and a second portion includes cover latch means, respectively, and each has cap receiver means. The backplane includes a generally flat mounting surface, having a plurality of preformed pilot holes arranged in a selected pattern, with at least one wiring channel recessed from the mounting surface and a plurality of clamp apertures formed adjacent the abutment edges. The backbone assembly connecting means includes interlock means for mutually engaging an adjacent backbone element, located on abutment edges, and at least one joining assembly, having an anchor plate extending from one abutment edge, and a cover plate extending from the opposite abutment edge, the interlock means and the joining assembly being located such that coplanar abutment of two backbone elements brings respective interlock means and joining assemblies into registration.

The cover element includes a horizontally extending cover plate bordered by two upstanding coverwalls and cover plate edges, and cover assembly connecting means for joining one cover element to another cover element. A first coverwall includes a hinge attachment means, adapted for mating with the backbone element hinge accepting means, such that the cover element is rotatably carried on the backbone element, and a second coverwall includes latch engagement means, adapted for latching engagement with the backbone element latch means. The cover assembly connecting means includes a front mating tab and front mating slot, carried on opposite the cover edges, adapted for mutual locking engagement, and cover locking assemblies, having a screw tab extending from one cover edge and a screw anchor point disposed on the opposite cover edge, arranged such that coplanar abutment of one cover element with a second cover element brings a screw tab into registration with the anchor point. The cover element is removably mounted on the backbone element to rotate between an open position providing access to the backbone element, and a closed position in which the latch attachment means engages the cover latch and the backbone and cover elements define an interior enclosure space. Also, the modules are assembled into the mounting assembly by coplanar abutment of modules with mutual engagement of the backbone assembly connecting means and the cover assembly connecting means.

Two identical endcap elements are joined to the outermost modules of the mounting assembly to enclose the interior enclosure space, each endcap element having clamp tabs engaged with the backbone element clamp apertures and mounting arms adapted for engagement with the cap receiving means.

DETAILED DESCRIPTION OF A PREFERRED EMBODIMENT

Figure 1:
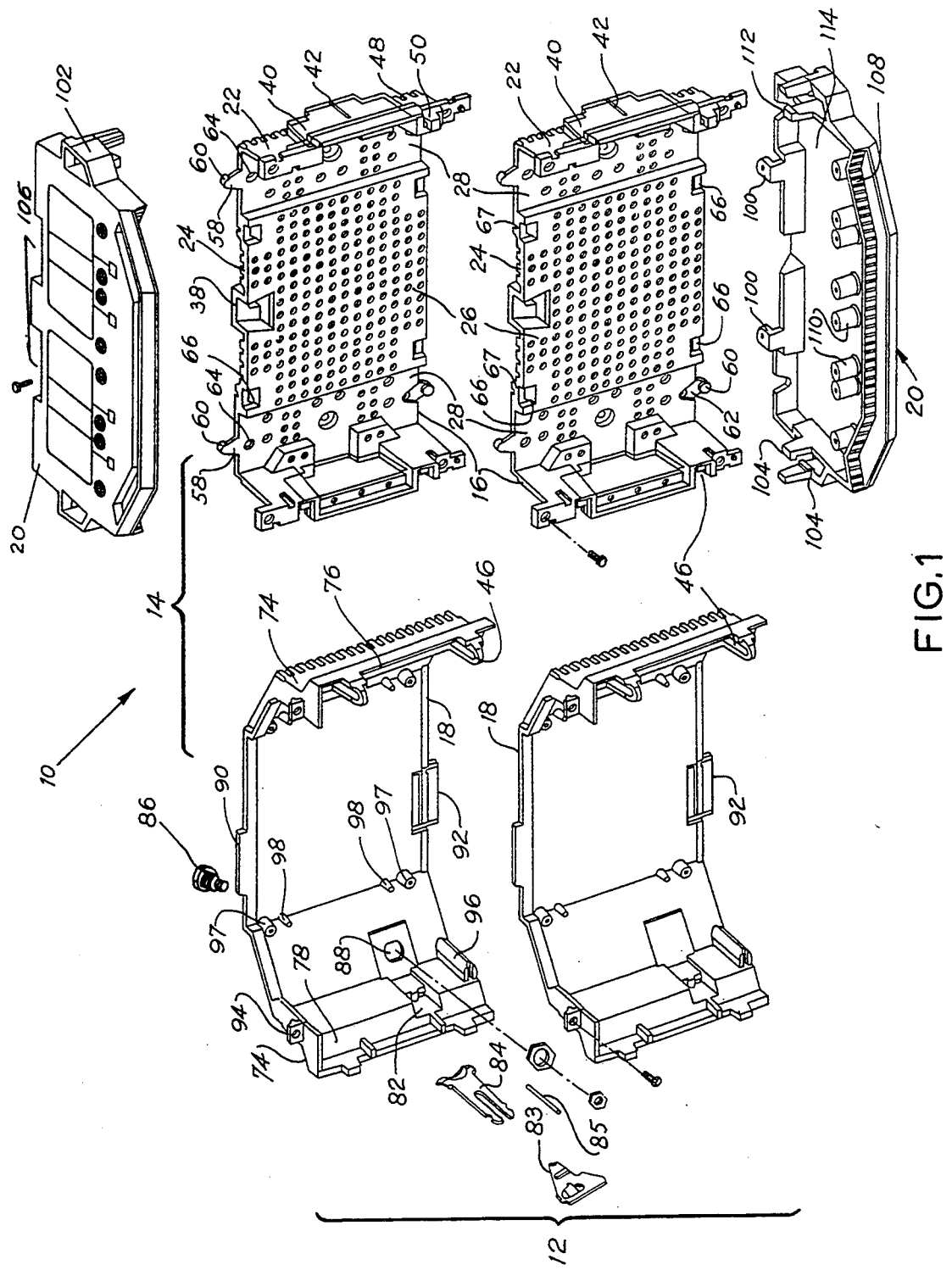
FIG. 1 is an exploded pictorial of an embodiment of the present invention.

An enclosure 10 according to the present invention is shown in FIG. 1. In the illustrated embodiment, the enclosure is designed to accommodate electrical and electronic equipment related to a building control system or electrical system. The advantages of the present invention are most apparent when employed to house a diverse assortment of equipment, as seen, for example, in a commercial building management system, rather than a single, known type of equipment, as would be seen in a residential electrical circuit breaker enclosure, for example.

The enclosure can generally be seen as including a mounting assembly 12, which forms the body of the enclosure, as a chest-like structure, and endcaps 20, which close off the top and bottom of the enclosure. The mounting assembly is modular, being built up from a number of individual enclosure modules 14; each module, in turn, includes a backbone 16 and cover 18. The drawing depicts an enclosure having two enclosure modules, but in practice the number of modules is varied to suit the requirements of the application. It is expected that enclosures using two, three or four modules will be most common, but fewer or more modules can be employed.

A number of different manufacturing techniques could be employed to fabricate the elements of the present invention. It is preferred to employ a plastic material, and particularly a structural foam polycarbonate blend, such as the material sold by the General Electric Company under the designation FN-150 and FN-130. It is also preferred to form the elements by injection molding, as known in the art.

Figure 2:
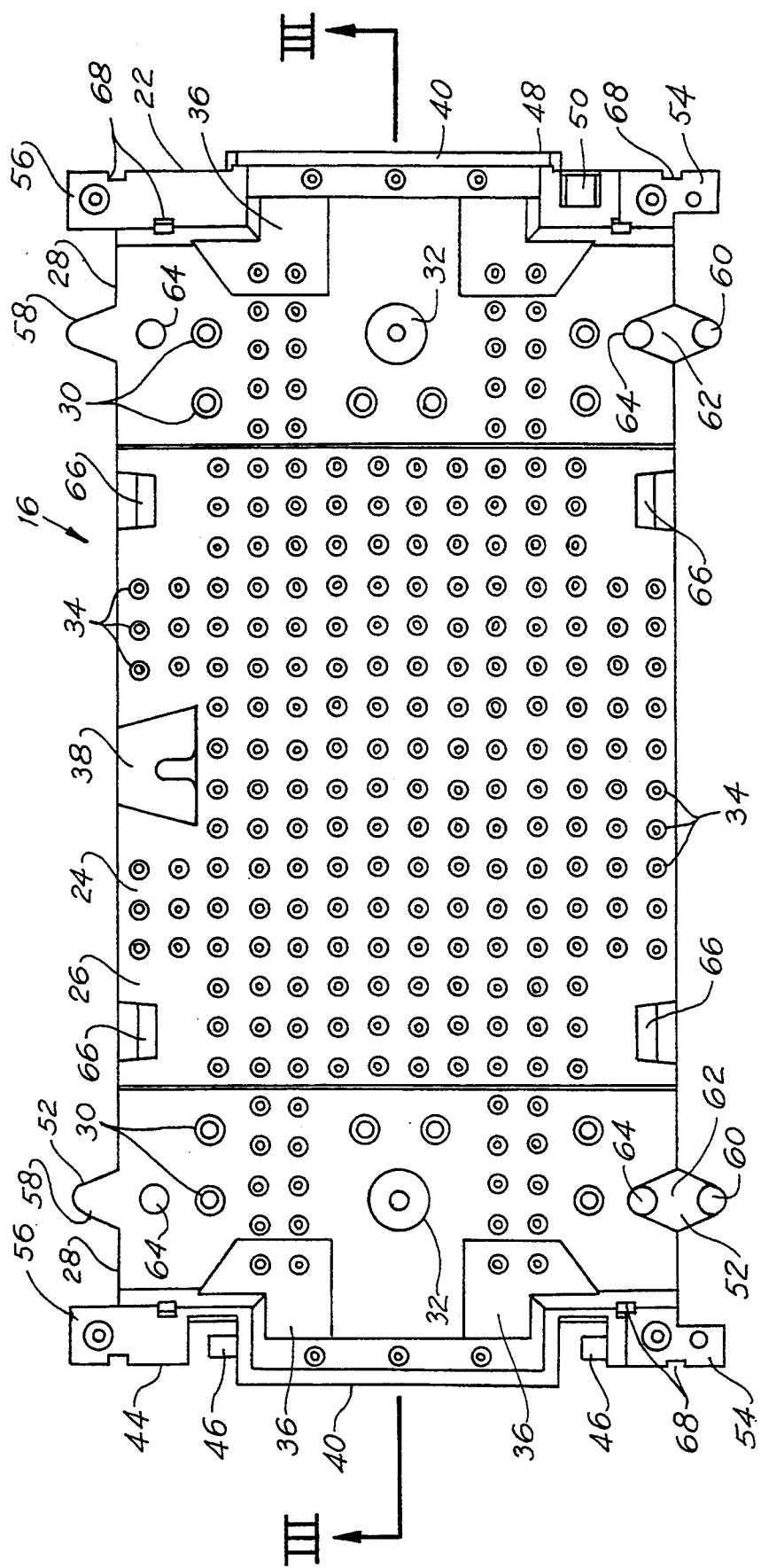
FIG. 2 is a plan view of a backbone element of the embodiment shown in FIG. 1.
Figure 3:
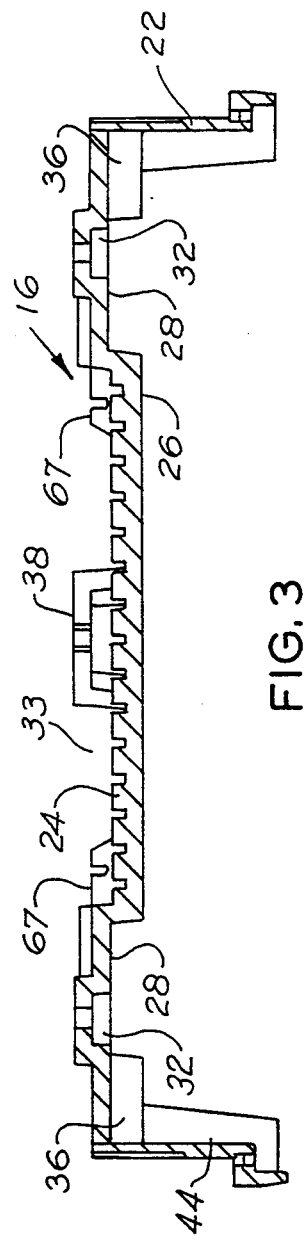
FIG. 3 is a cutaway front view taken on plane III—III of FIG. 2.

The backbone element 16 is shown more specifically in FIGS. 2 and 3. This component is generally rectangular in form, with two endpieces 22 extending upward from a generally flat backplane 24. The latter portion is itself subdivided into a mounting surface 26 flanked by two wiring channels 28. The wiring channels are designed to accommodate wiring harnesses extending between different equipment items and between equipment items and a network cable, power source or the like. To that end, wiring saddle apertures 30 are provided at various locations in the wiring channels, designed to accept the mounting pins on standard wire retainment devices, also known as wiring saddles or wire routers, such as the widely used Richco model WSBH-4-01. Although it could be located elsewhere, it is preferred also to locate a pair of recessed wall mounting apertures 32 in the wiring channels. To promote cooling without requiring a fan, convection vent 33 is formed in the backplane, preferably as an open area lying between the rear surface of the backplane and the surface upon which then enclosure is eventually mounted. This element is discussed more fully below.

The mounting surface is designed to accept equipment, such as electronic control units, and is therefore provided with a gridwork of preformed pilot holes 34, located on ½ inch centers. With an eye to user convenience, these pilot holes, in common with those prepared for all fasteners used on the enclosure, are designed for #8 screws, preferably of the type known as Plastite, made available to the art by Cam Car, or the equivalent thereof. Anticipating that some equipment may span the wiring channels, mounting islands 36 are provided at the far side of the wiring channels, with their tops coplanar with the mounting surface. The pilot hole grid is extended to these islands and to portions of the wiring channels also. A keyhole attachment 38 is provided at the upper side of the backbone element, so that the user can temporarily hang the enclosure while attaching it using bolts through mounting apertures 32.

The backbone sidepieces 22 differ from one another in several respects, while being very similar in others. Both pieces extend upward from the backplane, and both feature a conduit attachment ledge 40, for convenient attachment of a wiring conduit junction, with a drilling locator groove 42 formed in it to assist the installer in drilling an appropriate hole to accept the conduit collar. The lefthand sidepiece 44 includes the fixed portion of a hinge, hinge assembly 46. The righthand sidepiece 48 carries a door latch 50. Both the hinge and latch will be discussed further below.

An important feature of the invention is the systems that allow individual modules to be joined together in complete enclosures. The backbone connectors include the backbone interlocks 52, located on the upper and lower edges of the backplane, and the joining assemblies, each with anchor points 54 located on the lower edge of a sidepiece and cover plates 56 at the opposite edge. Interlocks 52 are four diamond-shaped elements preferably located at the edge of the wiring channels. One half of the interlock extends outward from the backbone as triangular tab 58, having an interlock boss 60 at its tip and a thickness half that of the wiring channel at that point. The other half of the diamond is interlock well 62, which has an interlock aperture 64 at its tip and is recessed half the thickness of the wiring aperture. The interlocks on the upper backbone edge are mirror images of those on the lower edge—that is, those on the upper edge have interlock tabs 58 flush with the wiring channel, the boss faces toward the rear of the backbone and the interlock well is formed in the underside of the backbone; the lower interlocks have the interlock tab flush with the underside of the backbone, the boss faces the front of the backbone, and the interlock well is formed directly in the wiring channel. Thus, as shown in FIG. 1, when two backbone elements are placed in abutment, with the mounting surfaces coplanar, the interlocks engage to locate the elements. Similarly, the joining assembly, components are formed so that the cover plates 56 overlap the anchor points 54 when two backbone elements are placed in coplanar abutment. For ease of assembly, the joining assembly components are provided with pilot holes, as discussed above. Given the information set out above, those in the art can modify the backbone interlock and joining systems in a number of ways. It has been found helpful, however, to provide two interlocks on each backbone edge, located in the wiring channels, and to provide a joining assembly at the upper and lower corners of the sidepieces.

Several design features of the backbone element will be mentioned here and explained more fully below. First, the backplane includes four clamp apertures 66, formed at the upper and lower edges of the mounting surface adjacent the wiring channels. These apertures are generally rectangular, leaving a bar of material between the aperture and the backbone edge, with two clamp arms 67 extending rearward from the backplane. Also, endcap attachment grooves 68 are formed in the joining assembly cover plates and anchor points, one groove asymmetrically on each side of the plate.

Figure 4:
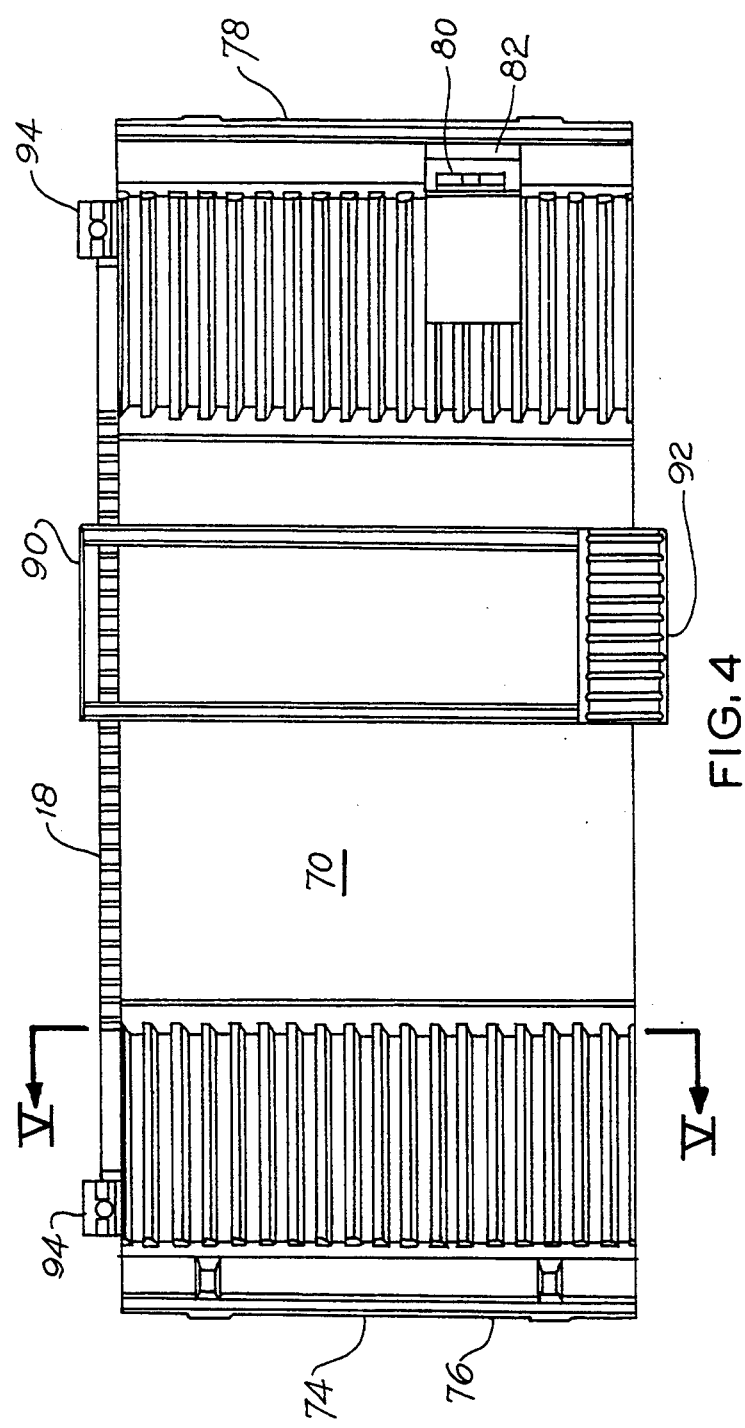
FIG. 4 is a plan view of a cover element of the embodiment shown in FIG. 1.
Figures 5, 6:
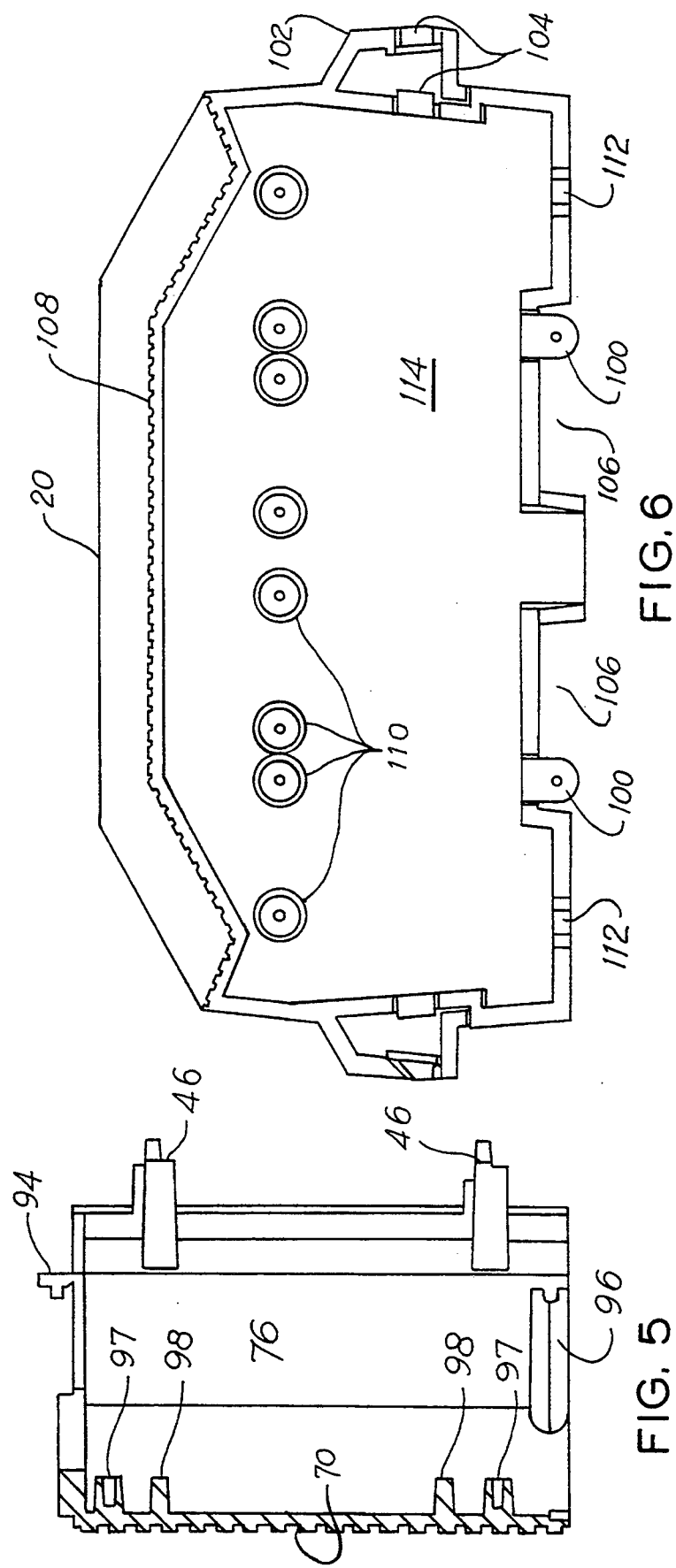
FIG. 5 is a cutaway front view taken on plane V—V of FIG. 4.
FIG. 6 is a plan view of an endcap of the embodiment shown in FIG. 1.

The cover element 18 can also be seen in FIG. 1 as well as in FIGS. 4 and 5. As with the backbone, the cover element includes a cover plate 70 and cover walls 74. The overall design of the cover element can be adapted to the application, so long as the cover element performs the function of mating with the backbone element to protect equipment mounted within the enclosure. Thus, the cover plate can be joined to the cover walls at a right angle, or the cover plate could be curved, or a portion of the plate surface can form an angle, as shown in the preferred embodiment. Again similar to the backbone, the sidepieces differ structurally. A lefthand coverwall 76 includes the movable portion of hinge assembly 46. Those in the art will be able to design a suitable hinge mechanism from the variety of such devices known to the art, given the requirement that the cover element should be able to rotate around the fixed hinge portion and should be removable from the backbone element. The righthand coverwall 78 carries a latch mechanism 80 in latch aperture 82. The latch is generally conventional, consisting of a latch handle 84 extending through the latch aperture, engaging a latch pawl 83 and biased by spring 85, designed to engage the backbone latch 50. If desired, a conventional lock 86 can be mounted in a lock aperture 88 formed in the cover plate adjacent the latch aperture.

The cover element also is adapted to be joined with other cover elements to provide modular assembly of an enclosure, through a cover element joining assembly.

A three-point connecting design is preferred. At the front of the element, a front mating slot 90 is provided on the upper edge of the cover plate, with a matching front mating tab 92 located on the bottom edge. These elements can meet in sliding or snap-on engagement, as desired. Each coverwall carries a screw tab 94 extending from one edge and a screw anchor point 96 extending from the other, arranged such that when two cover elements are brought into coplanar abutment, the screw tab overlies the screw anchor point. It is preferred that pilot holes be provided for easy assembly.

Other features can be incorporated into the cover element as desired. For example, mounting posts 97 and pins 98 can be provided on the inside surface of the cover to allow equipment to be mounted there. Alternatively, cover elements can be provided with a portal formed into the cover plate to allow viewing of a display mounted on the backbone element. Also, the screw tab and anchor points may be formed so that they can be snapped off in certain circumstances, as noted below.

The ends of the enclosure are covered by endcaps 20, shown in FIGS. 1 and 6. It is an important feature of the invention that the endcaps are identical, with the same unit serving as either the top or bottom end of the enclosure. The exact shape of this element is dictated by the design of the backbone and cover elements, as the edges of the encap must bear against the edges of the backbone and the cover element.

Each endcap is joined to a backbone element in two ways. First, two clamp tabs 100 extend rearward from the endcap body, adapted to engage the backbone clamp apertures 66. As can be appreciated from FIG. 1, inserting the clamp tabs into the clamp apertures brings the encap edges into registration with the backbone and cover element edges. This operation positions the clamp tabs between the clamp arms 67, and a screw or other suitable fastener locks the encap in place. At the same time, two mounting arms 102, located at the sides of the encap and extending upwards, have keys 104 that engage endcap attachment grooves 68 on the backbone.

If desired, an aluminum laminate layer can be applied to the inner surface of the endcap during manufacture, as known in the art. Preferably, the laminate is an aluminum foil having adhesive preapplied to one side for easy mounting, widely available to the art from a number of sources. This layer would allow for easy grounding of conduits, to accommodate the requirement that multiple conduits (the normal configuration) must be electrically continuous. Along with their other shortcomings, prior art enclosures require the use of grounding lugs and wires to meet this requirement, a cumbersome and costly solution.

Other features of the endcap include convection ports 106, designed to overlie the mounting enclosure convection vents 33. Further cooling is provided by the position of front cap wall 108, which is recessed from the edge of the endcap sufficiently to provide an air gap. Mounting posts 110 may be provided for equipment mounting on the endcaps, and edge cutouts 112 are located as required in the endcap edge to provide clearance for backbone elements such as the interlocks 58.

The entire mounting assembly 12 is assembled by first bringing together the pieces of the selected number of enclosure modules 14. Then the backbone elements are joined by abutting elements, located in place by the interlocks 52 and secured by screws applied at the cover plates 56 and anchor points 54. Endcaps 20 are then attached by sliding the mounting arms onto the backbone endcap receiving mechanism of the attachment grooves 68 and the surrounding cover plate or anchor point, and by engaging the clamp tabs 100 into the clamp apertures 66 and securing them with screws. In similar fashion the cover elements are abutted, located by their mating slots 90 and tabs 92, with screws fastening them at the screw tab 94 and anchor point 96. The assembled enclosure door is hung on the enclosure body using the hinge assembly 46. It should be noted that the complete assembly also aligns the convection vents 33 of each backbone element, providing a continuous convection path, or chimney, up the back of the enclosure. Heat generated by the equipment within the enclosure will induce a convective flow, as in a chimney, and it has been found that this arrangement provides sufficient cooling to eliminate the need for an internal fan in most installations. Finally, the entire enclosure can be mounted on a wall or other flat surface for use.

It is important to note that the assembly process requires that the elements be moved only in a direction perpendicular to the wall on which the enclosure is mounted—no side-to-side movement is required to engage two backbone elements, to mount an endcap to a backbone element, or to hang the enclosure door. This design insures that an enclosure can be assembled in the close quarters typically allocated to such devices, and that the entire unit does not have to be removed to add another module or the like. This is particularly important in considering expanding an existing installation by adding additional equipment.

Those in the art will understand that the present invention can be modified and altered in a number of ways without departing from the spirit of the invention. For example, the material and manufacturing techniques could be altered, or a different scheme for mounting equipment could be employed, or a different system could be used for mounting the cover element on the backbone element. These and other changes fall within the scope of the invention, which is defined solely by the claims appended hereto.

I claim:

1. A wall-mounted enclosure for mounting electrical and electronic equipment comprising:
   a mounting assembly including a plurality of mounting modules, each said module including
      a backbone element, having a horizontally extending backplane bordered by two upstanding side portions and two abutment edges, and further having interassembly connecting means for joining one said backbone element to an adjacent said backbone element, wherein
      a first said side portion includes hinge accepting means;
      a second said portion includes cover latch means;
      each said side portion includes cap receiver means;
      said backplane includes a generally flat mounting surface, having a plurality of preformed pilot holes arranged in a selected pattern thereon; at least one wiring channel recessed from said mounting surface; and a plurality of clamp apertures formed adjacent said abutment edges; and
      said backbone element interassembly connecting means includes interlock means for mutually engaging an adjacent backbone element, located on the abutment edges, and at least one joining assembly, having an anchor plate extending from one said abutment edge, and a cover plate extending from the second abutment edge, said interlock means and said joining assembly being located such that coplanar abutment of two said backbone elements brings the respective interlock means and joining assemblies into registration;

a cover element, including a horizontally extending cover plate bordered by two upstanding coverwalls and cover plate edges, and cover assembly connecting means for joining one said cover element to another said cover element, wherein a first said coverwall includes a hinge attachment means, adapted for mating with said backbone element hinge accepting means, such that said cover element is rotatably carried on said backbone element;

a second said coverwall includes latch engagement means, adapted for latching engagement with said backbone element cover latch means;

said cover assembly connecting means includes a front mating tab and a front mating slot, carried on opposite said cover plate edges, adapted for mutual locking engagement, and cover locking assemblies, having a screw tab extending from one said cover plate edge and a screw anchor point disposed on the opposite cover plate edge, arranged such that coplanar abutment of one said cover element with a second said cover element brings a said screw tab into registration with said screw anchor point;

wherein said cover element is removably mounted on said backbone element to rotate between an open position providing access to said backbone element, and a closed position in which said latch engagement means engages said cover latch means and said backbone and cover elements define an interior enclosure space; and wherein said modules are assembled into said mounting assembly by coplanar abutment of said modules with mutual engagement of said backbone element interassembly connecting means and said cover assembly connecting means; and two identical endcap elements, joined to the outermost modules of said mounting assembly to enclose said interior enclosure space, each said endcap element having clamp tabs engaged with said backbone element clamp apertures and mounting arms adapted for engagement with said cap receiver means.

2. The wall-mounted enclosure of claim 1, wherein said backplane includes two said wiring channels, disposed on either side of said mounting surface; and a plurality of mounting islands located in said wiring channels, the tops of said islands being coplanar with said mounting surface and having preformed pilot holes therein.

3. The wall-mounted enclosure of claim 1, wherein said backplane further includes at least one convection vent formed in the side thereof opposite said mounting surface and extending across said backplane from one said abutment edge to another, such that a said convection vent traverses the reverse surface of said backplane; and said endcap elements include at least one convection vent aperture positioned for fluid communication with said convection vent.

4. The wall-mounted enclosure of claim 1, wherein said backbone element interassembly connecting means are adapted for mutual engagement solely by unidirectional motion perpendicular to said mounting surface.

5. The enclosure of claim 1, wherein each said endcap element further includes an electrically conductive layer applied to the inner surface thereof.

* * * * *